US006201448B1

(12) United States Patent
Tam et al.

(10) Patent No.: US 6,201,448 B1
(45) Date of Patent: Mar. 13, 2001

(54) METHOD AND APPARATUS TO REDUCE CLOCK JITTER OF AN ON-CHIP CLOCK SIGNAL

(75) Inventors: Simon M. Tam, Redwood City; Stefan Rusu, Sunnyvale, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,925

(22) Filed: Dec. 28, 1999

(51) Int. Cl.[7] ................................. H03L 7/06; H03L 7/08; G06F 1/04; G06F 1/10
(52) U.S. Cl. ............................ 331/25; 331/1 A; 327/156; 327/158; 327/159
(58) Field of Search ................................. 331/1 A, 18, 25; 327/156–159

(56) References Cited

U.S. PATENT DOCUMENTS

| | | | |
|---|---|---|---|
| 4,829,258 | 5/1989 | Volk et al. | 328/155 |
| 4,847,516 | * 7/1989 | Fujita et al. | 307/269 |
| 4,868,522 | * 9/1989 | Popat et al. | 331/2 |
| 5,281,863 | 1/1994 | Bond et al. | 307/271 |
| 5,298,866 | * 3/1994 | Kaplinsky | 328/155 |
| 5,384,502 | 1/1995 | Volk | 327/157 |
| 5,412,349 | 5/1995 | Young et al. | 331/34 |
| 5,446,867 | 8/1995 | Young et al. | 395/550 |
| 5,565,816 | * 10/1996 | Coteus | 331/2 |
| 5,630,107 | 5/1997 | Carmean et al. | 395/560 |
| 6,014,048 | * 1/2000 | Talaga, Jr. et al. | 327/156 |
| 6,111,448 | * 8/2000 | Shibayama | 327/293 |

OTHER PUBLICATIONS

Ian A. Young, et al., "SA 20.1: A 0.35pm CMOS 3–880MHz PLL N/2 Clock Multiplier and Distribution Network with Low Jitter for Microprocessors," Intel Corp., Feb. 1997, 9 pages.

* cited by examiner

*Primary Examiner*—David Mis
(74) *Attorney, Agent, or Firm*—Cynthia T. Faatz

(57) ABSTRACT

An on-die clock generator. For one aspect of the invention, the on-die clock generator includes a phase-locked loop (PLL) circuit having a first input coupled to receive an external clock signal and an output coupled to provide an on-die clock signal to be used during a normal operating mode of an integrated circuit. The on-die clock generator also includes a local clock generator circuit having an input coupled to receive the on-die clock signal and an output coupled to provide a local PLL feedback clock signal to a second input of the PLL.

29 Claims, 7 Drawing Sheets

METHOD AND APPARATUS TO REDUCE CLOCK JITTER OF AN ON-CHIP CLOCK SIGNAL

BACKGROUND

1. Field

An embodiment of the present invention relates to the field of integrated circuit design and, more particularly, to the design of on-chip clock generation circuits.

2. Discussion of Related Art

Many modern integrated circuit devices, such as microprocessors, for example, use an on-chip phase locked loop (PLL) to synthesize a core clock signal. The core clock signal is then distributed across the device for use by various units. Such on-chip clock generation is advantageous in terms of hiding on-chip clock delays from external devices and in providing an efficient approach for clock frequency multiplication.

An example of a processor 100 including a prior on-chip clock generator unit 105 is shown in FIG. 1. At an input/output unit 110, an external clock signal 115 is received at a pin, for example, of the processor device 100. The external clock signal 115 is routed to an input of a PLL 120 in the clock generator unit 105. A PLL feedback clock signal 125 is also received by the PLL 120 to provide phase locked operation.

An output clock signal from the PLL 120 is buffered by one or more buffers 130 and provided as a core clock signal 135 through a clock distribution network 138 (only one signal line of which is shown) to various locations across the processor 100 including a bus clock generator 140. The bus clock generator 140 is provided to generate a clock signal for clocking external bus transactions. This clock signal may also be used as the PLL feedback clock signal 120.

The on-chip clock circuit of FIG. 1 may have some disadvantages, however, particularly when used on a large die, such as a microprocessor, in a high performance environment. The PLL feedback clock signal 120 is typically generated in the input/output area of a device. This input/output area is usually located near the periphery of a die for performance reasons.

The core clock signal 135 is delivered from the clock generator unit 105 to the input/output unit 110 by the above-mentioned clock distribution network including the signal line 138 shown in FIG. 1. Because the clock generator unit 105 provides the core clock signal to locations all over the processor 100, the clock generator unit is often located near the center of the die to facilitate distribution of the signal. Thus, particularly for a large die, the core clock signal 135 may traverse a relatively long distance across the processor 100, before reaching the bus clock generator 140.

As the core clock signal 135 is communicated from the clock generator unit 105 to the input/output unit 110 through various areas of the processor 100, such as the units 1 . . . n, the signal 135 is susceptible to localized power supply noise and signal cross-coupling in various regions. This noise is difficult to control due to the various activity and circuitry types across the processor 100 and may result in delay variation in the core clock signal 135 as it arrives at the bus clock generator 140. Because the PLL feedback clock signal 120 used to generate the core clock signal 135 is derived by the bus clock generator 140 from this core clock input signal 135, such delay variation may lead to clock jitter of the core clock signal 135.

Clock jitter can directly affect the overall performance of the processor 100 by effectively reducing the input/output (I/O) bus transaction rate. Because jitter results in a variation in clock edge placement, the bus transaction rate is reduced to account for this variation.

Other types of integrated circuit devices, such as digital signal processors, communications chips, cache memories, etc. that use on-die clock generators may present similar issues.

SUMMARY OF THE INVENTION

A method and apparatus to reduce clock jitter of an on-chip clock signal are described. In accordance with one embodiment, an on-die clock generator includes a phase-locked loop (PLL) circuit having a first input coupled to receive an external clock signal and an output coupled to provide an on-die clock signal to be used during a normal operating mode of an integrated circuit. The on-die clock generator also includes a local clock generator circuit having an input coupled to receive the on-die clock signal and an output coupled to provide a local PLL feedback clock signal to the PLL.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus to reduce clock jitter of an on-die clock signal are described. In the following description, particular types of integrated circuits and integrated circuit configurations are described for purposes of illustration. It will be appreciated, however, that other embodiments are applicable to other types of integrated circuits and to integrated circuits configured in another manner. For ease of description, at various places herein, a reference number corresponding to one or more signal lines may also be used to refer to the signal(s) communicated over the signal lines.

For one embodiment, a clock generator unit includes a phase-locked loop (PLL) circuit that receives a local PLL feedback signal generated within the clock generator unit. In this manner, clock jitter on a clock output signal from the PLL may be reduced.

Figure 1:
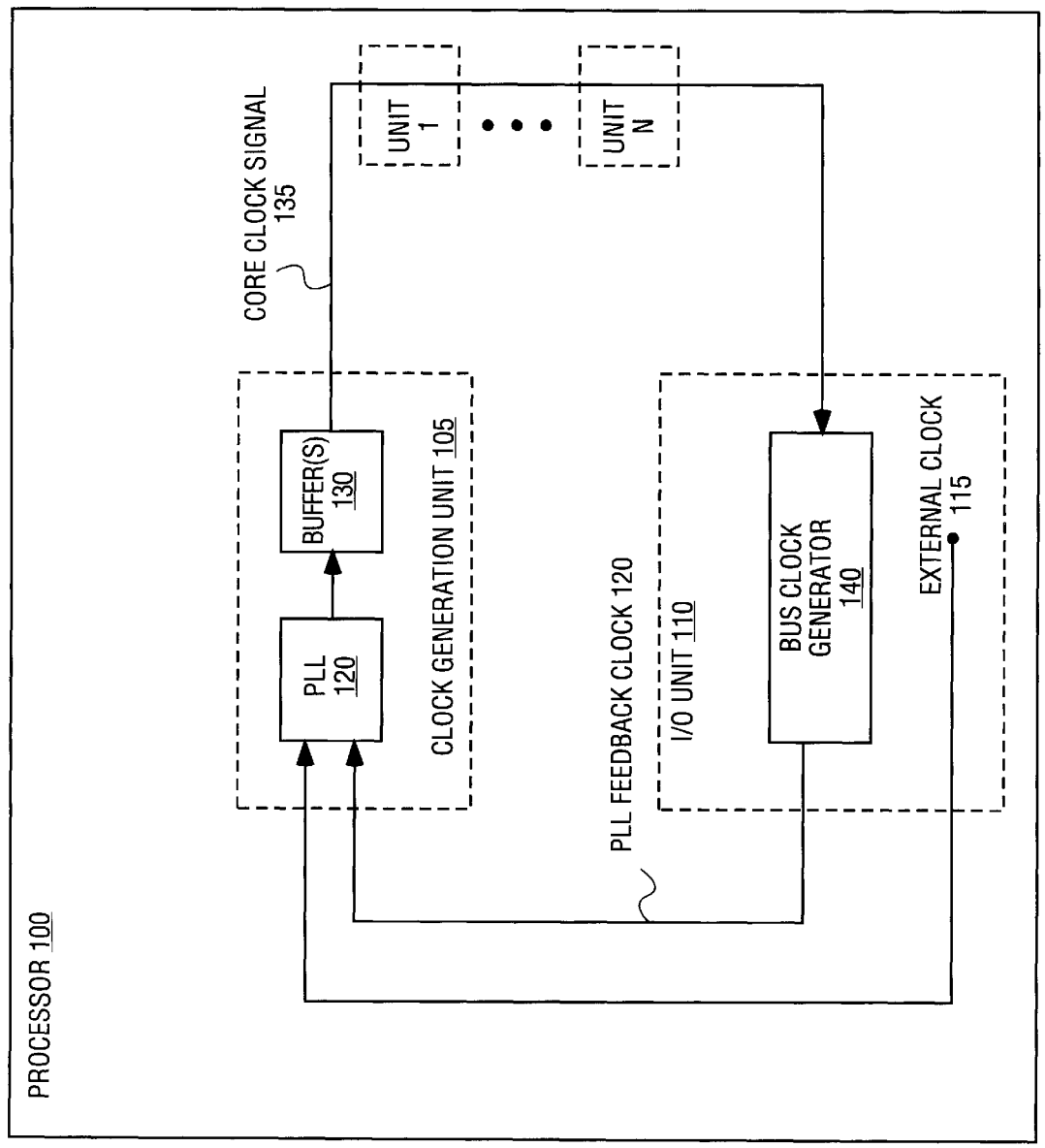
FIG. 1 is a block diagram showing a prior on-chip clock generation approach.
Figure 2:
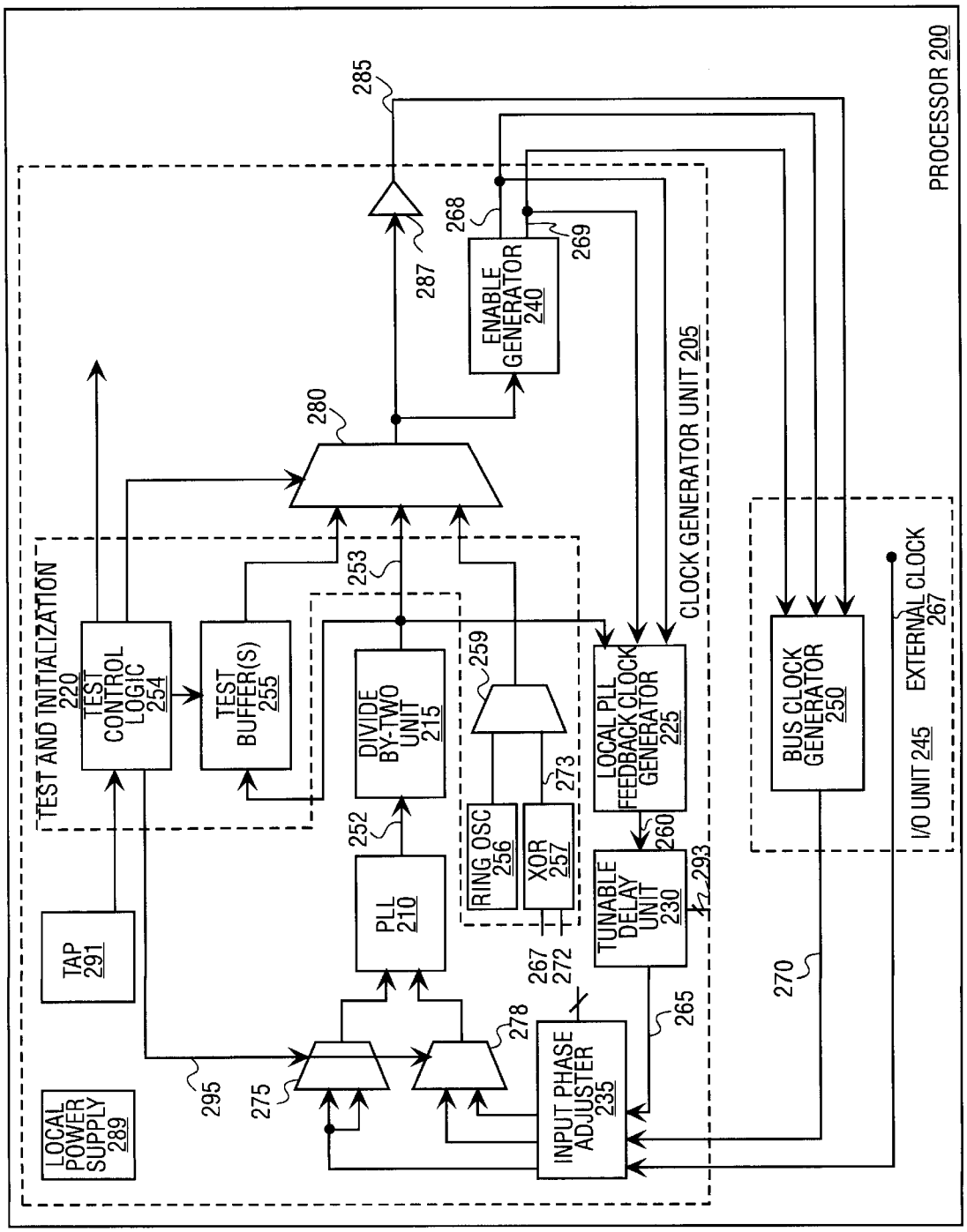
FIG. 2 is a block diagram showing a processor including a clock generator in accordance with one embodiment.

FIG. 2 is a block diagram of a processor 200 including a clock generator unit 205 of one embodiment. The processor 200 may be a microprocessor, such as a microprocessor supplied by Intel Corporation of Santa Clara, Calif., for example. Other types of processors, including, for example, microcontrollers, application specific integrated circuits (ASICs), digital signal processors and microprocessors from other suppliers are also within the scope of various embodiments. Further, while the clock generator unit 205 is shown and described as being provided on a processor, it will be appreciated that other types of integrated circuits that use an on-chip clock, may also include clock generators in accordance with various embodiments.

For the embodiment of FIG. 2, the clock generator unit 205 includes a phase-locked loop (PLL) circuit 210, a divide-by-two unit 215, test and initialization logic 220, a local PLL feedback clock generator 225, a tunable delay unit 230, an input phase adjuster 235 and a bus clock enable generator 240. In addition to the clock generator unit 205, the processor 200 includes an input/output (I/O) unit 245 including a bus clock generator 250.

For one embodiment, the clock generator unit 205 is located in a central portion of the processor 200 die while the I/O unit 245 is located near a periphery of the processor 200 die. For other embodiments, the clock generator unit and/or the I/O unit may be located in a different area of the processor 200 die. It will be appreciated that the processor 200 may include other circuitry and other types of units not shown in FIG. 2.

The PLL circuit 210 may be any type of PLL that can be used to synthesize an on-chip clock signal from an external clock signal. For one embodiment, the PLL 210 may be a PLL such as the PLL described in the publication entitled "A 0.35 um CMOS 3-880 MHz PLL N/2 Clock Multiplier and Distribution Network with Low Jitter for Microprocessors," ISSCC Digest of Technical Papers, 1997 by Young et al. For other embodiments, other types of PLLs may be used.

The test and initialization logic 220 of one embodiment includes test control logic 254, one or more test buffer(s) 255, a ring oscillator 256, an exclusive OR (XOR) circuit 257 and a multiplexer (mux) 259. The test and initialization logic 220 may be provided for some embodiments to test particular clock-related features of the processor 200 and/or to initialize the clock generator unit 205 for operation. For other embodiments, the test and initialization logic 220 may not include all of the elements shown in FIG. 2 or may otherwise be configured in a different manner.

In operation, upon initialization of the processor 200 for one embodiment, the ring oscillator 256 provides a signal that is received and communicated by the muxes 259 and 280 and distributed throughout the processor 200 via the clock distribution network 285. In a test mode, the mux 259 may instead selectively transmit a PLL bypass clock signal 273 that is output from the XOR circuit 257 in response to receiving the external clock signal 267 and an external bypass clock signal 272.

While the logic 220 may be used during initialization and test modes, the test and initialization logic 220 is not typically used during a normal operating mode of the processor 200. During such a normal operating mode, the external clock signal 267 (received by the processor 200 at the I/O unit 245 through a pin of the processor 200, for example) is communicated to an input of the PLL 210 through the input phase adjuster 235 and a mux 275. The PLL 210 also receives a PLL feedback clock signal through the input phase adjuster 235 and a mux 278 as described in more detail below.

The PLL 210 provides at an output a pre-core clock signal 252 that is synthesized from the external clock signal 267 and for one embodiment, is twice the operating frequency of the processor 200 core. The pre-core clock signal 252 is then divided by two for this embodiment by the divide-by-two unit 215 to generate a 50% duty cycle core clock signal 253 that may be used by other units within the processor 200.

For some embodiments, the divide-by-two unit 215 may not be included. For other embodiments, the divide-by-two unit 215 may be replaced by a unit that divides the pre-core clock signal 252 by a different number or a unit that multiplies the pre-core clock signal 252 to produce a higher frequency core clock signal.

The core clock signal 253 is communicated to an input of a mux 280, which, during the normal mode of operation of the processor 200, passes the core clock signal to the bus clock enable generator 240 and to a clock distribution network 285 through one or more buffers 287. During a test or initialization mode, for example, the core clock signal may be communicated to the test buffer(s) 255 and a signal from the test buffer(s) 255 or the mux 259 may instead be selected by the mux 280. Selection control of the mux 280 may be provided by test control logic 254 that can be accessed by other circuitry on the processor 200 including a test access port (TAP) 291 as described in more detail below.

The clock distribution network 285 provides the core clock signal to various locations around the processor 200 including the I/O unit 245. It will be appreciated that, while only one signal line is shown for the clock distribution network 285, additional signal lines that route the core clock signal to other locations on the processor 200 may be included in the clock distribution network 285.

The core clock signal 253 is received over the clock distribution network 285 by the bus clock generator 250 along with bus clock enable signals 268 and 269 provided by the bus clock enable generator 240. For one embodiment, the bus clock enable signals 268 and 269 are used by the bus clock generator 250 along with the core clock signal 253 to generate a bus clock signal 270 to be used to clock external bus transactions. The bus clock enable signals 268 and 269 are used, along with other input signals for some embodiments, to determine a ratio of a frequency of the core clock signal 253 to a frequency of the bus clock signal 270. By using two bus clock enable signals 268 and 269 for this embodiment, a fractional frequency relationship between the signals can be provided.

Figure 6:
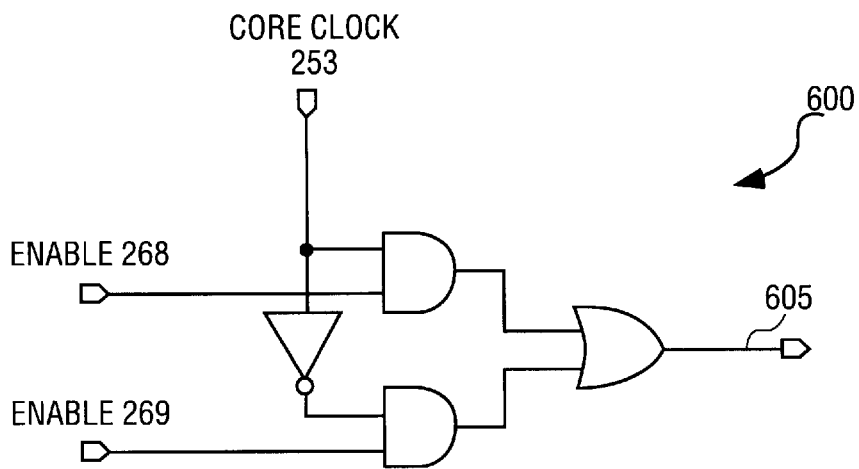
FIG. 6 is a diagram of a circuit that may be used for one embodiment to provide each of the bus clock generator and the local PLL feedback clock generator of FIG. 2.
Figure 7:
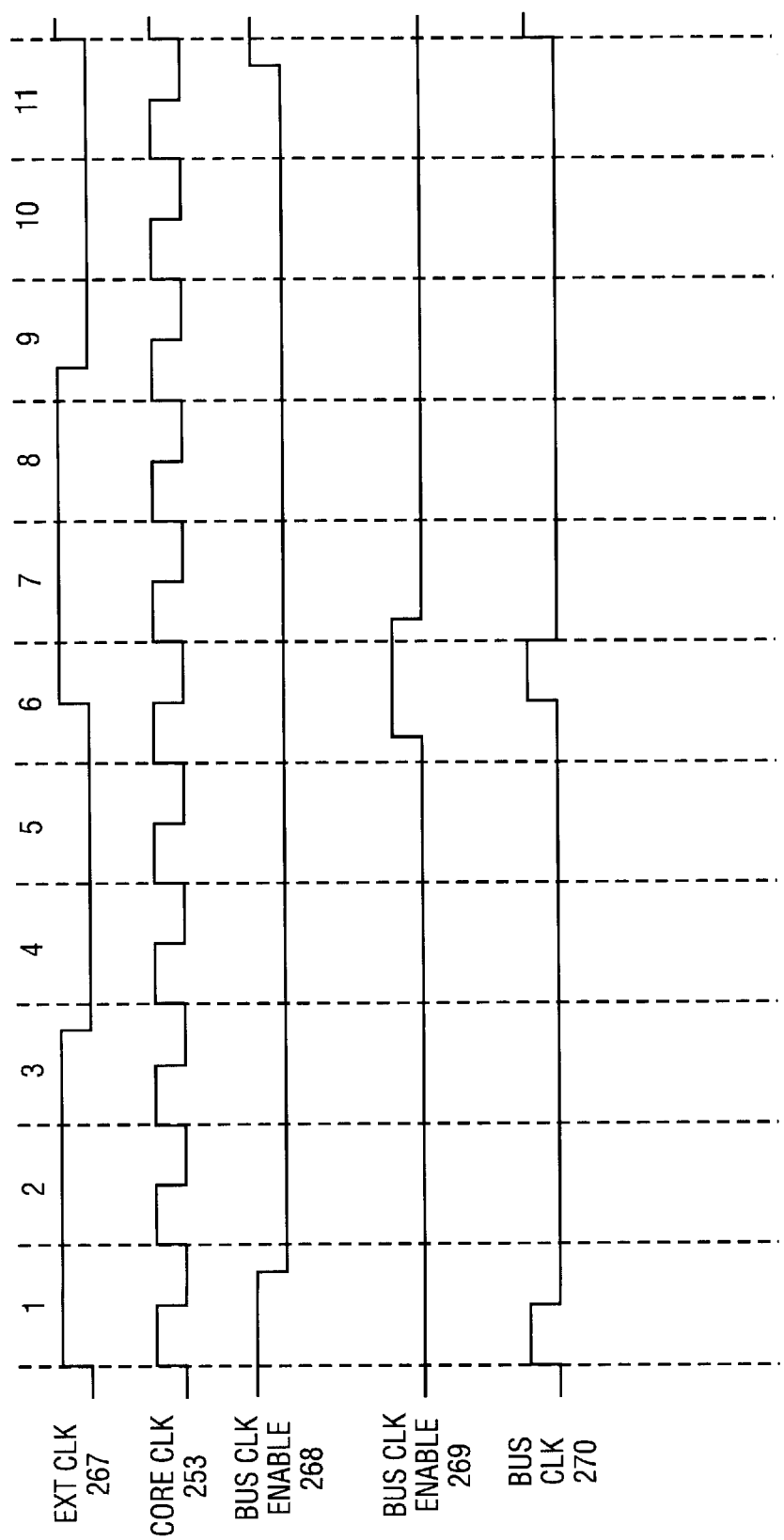
FIG. 7 is a timing diagram showing exemplary core clock, external clock, bus clock enable and bus clock signals for the clock generator unit of FIG. 2.

FIG. 6 shows an example of a circuit 600 that may be used to provide the bus clock generator 250. The circuit 600 receives the core clock signal 253 and the bus clock enable signals 268 and 269 and produces an output clock signal 605. The output clock signal 605 is high when the core clock signal is high and the first bus clock enable signal 268 is high or when the core clock signal is low and the second bus clock enable signal 269 is high. FIG. 7 shows exemplary core clock, external clock, bus clock enable and bus clock signals of one embodiment where an 11/2 bus fraction (core clock to bus clock) is provided. It will be appreciated that one or more of the signal relationships shown in FIG. 7 may be different for other embodiments or implementations.

Also for other embodiments, the bus clock enable generator 240 may generate a different number of enable signals. For embodiments in which the frequency of the core clock signal 253 and the bus clock signal 270 are the same, a bus clock enable generator may not be used.

The bus clock signal 270, in addition to being used to clock external bus transactions, may also be used as the feedback signal to the PLL 210 for some embodiments, and thus, is alternately referred to herein as a global PLL feedback clock signal. For this reason, the reference number 270 is used interchangeably herein to refer to the global PLL feedback clock signal and the bus clock signal.

The core clock signal 253 is concurrently provided to the local PLL feedback clock generator 225 which also receives bus clock enable signals 268 and 269. For one embodiment, the local PLL feedback clock generator 225 is matched in design (e.g. circuit delay, functionality and phase relationship with respect to the core clock signal) to the bus clock generator 250 such that the local feedback clock generator 225 and the bus clock generator 250 produce substantially identical output signals in response to the same input signals.

In response to receiving the core clock signal 253 and the bus clock enable signals 268 and 269, the local PLL feedback clock generator 225 produces a local PLL feedback clock signal 260. Thus, where the circuit 600 is used to provide the local PLL feedback clock generator 225, the output clock signal is the local PLL feedback clock signal 260. This local PLL feedback clock signal 260 is substantially identical in frequency and duty cycle to the global PLL feedback clock signal 270. For some embodiments the local PLL feedback clock signal 260 may be used instead of the global PLL feedback clock signal 270 to provide the feedback signal to the PLL 210.

For one embodiment, in order for the PLL 210 to operate properly when using the local PLL feedback clock signal 260 instead of the global PLL feedback clock signal 270, a delay of the local PLL feedback clock signal 260 is adjusted using the tunable delay unit 230. The tunable delay unit 230 receives the local PLL feedback clock signal 260 and provides a delayed local PLL feedback clock signal 265 at its output. For one embodiment, the delay unit 230 is tuned to replicate the delay of the clock distribution network 285 such that the delay of the delayed local PLL feedback clock signal 265 is substantially identical to the delay of the global PLL feedback clock signal 270.

The delay unit 230 is tunable such that variations between different processing runs, for example, may be accounted for in adjusting the signal delay of the local PLL feedback clock signal 265. For integrated circuits in which variations are within a relatively tight range, it may be possible to provide a fixed delay in place of the tunable delay unit 230.

The delay provided by the delay unit 230 may be adjusted to match a delay of the global PLL feedback clock signal 270 as mentioned above or another signal from the clock distribution network, for example. Alternatively, the delay of the local PLL feedback clock signal 260 may be adjusted to achieve a desired performance level for the processor 200 and/or to optimize external to internal bus timings. Other goals for adjusting the local PLL feedback clock signal 260 delay are also within the scope of various embodiments.

For one embodiment, the tunable delay unit 230 is programmed through the TAP 291 that is coupled to control input(s) 293 of the delay unit 230. The TAP 291 is an externally accessible port that may also be used during self-testing or for other functions of the processor 200. The tunable delay unit 230 may include, for example, register(s) and/or fuses that provide a given delay depending on a value received by the control inputs 293 through the TAP 291.

The desirable delay to be provided by the tunable delay unit 230 may be determined, for example, by testing the processor 200 using a production very large scale integration (VLSI) tester and observing clock-related output timings for the processor 200. The delay can then be adjusted prior to running the test again. This process may be repeated as many times as necessary to achieve a desired performance level or to match a delay between the local PLL feedback clock signal and a clock distribution delay, for example. Thus, a characterization approach can be used for one or more representative chips from a particular production run to determine the delay to be provided by the tunable delay element 230.

For other embodiments, the tunable delay element 230 may be programmed in another manner using, for example, different types of software-accessible elements. An example of such an embodiment is described below in reference to FIG. 4. Further, other types of control circuitry, such as one or more state machines provided on processor 200, for example, may be used to control the delay for some embodiments.

Figure 8:
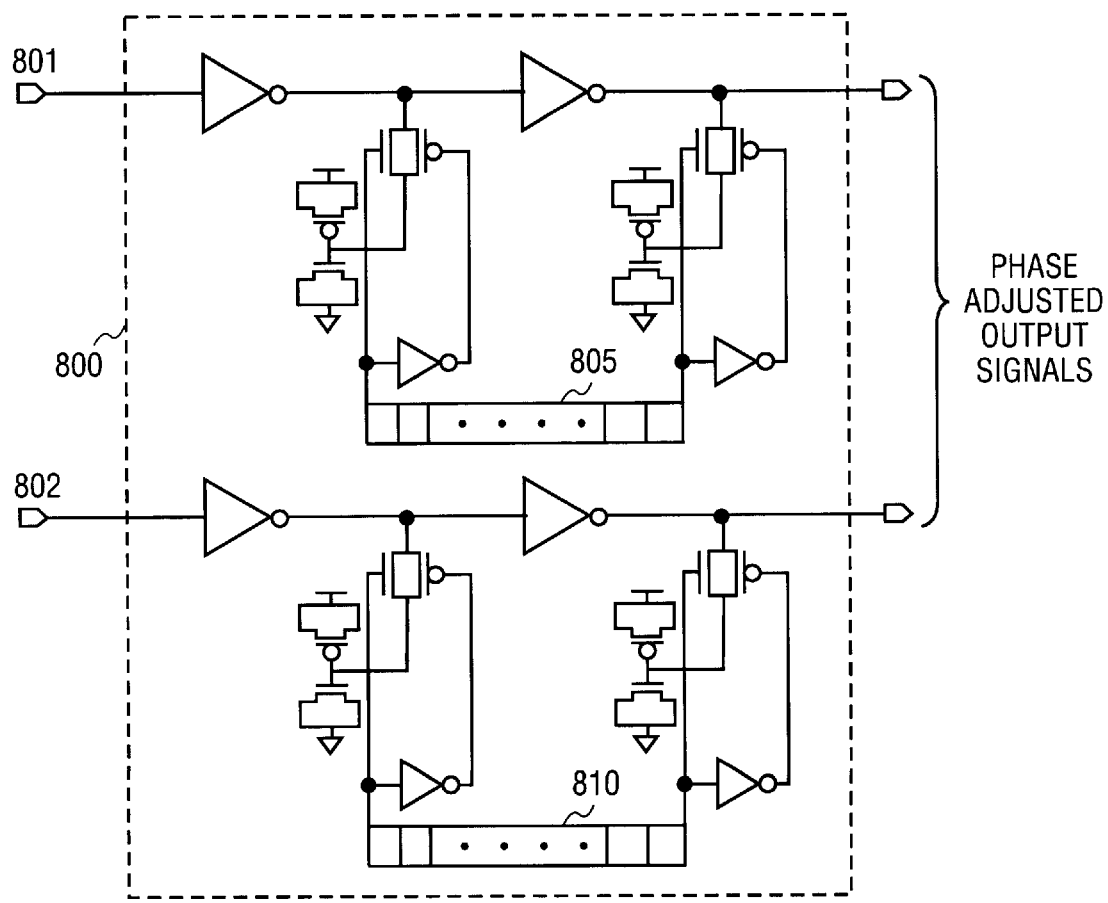
FIG. 8 is a diagram of a circuit that may be used for one embodiment as the input phase adjuster circuit of FIG. 2.

Once the delay unit 230 is tuned as desired, in operation, the delayed local PLL feedback clock signal 265, the global PLL feedback clock signal 270 and the external clock signal 267 are all received at the input phase adjuster 235. FIG. 8 shows an example of a circuit that may be used to provide the input phase adjuster 235 that adjusts the relative phase relationship between two signals 801 and 802 using programmable delay control registers 805 and 810. For some embodiments, additional decoding logic may also be provided to reduce a number of control bits used to program the delay control registers 805 and 810 and a mux may be provided to select the input signals to be adjusted.

The input phase adjuster 235 is tunable in a manner similar to the tunable delay unit 230 using delay control registers, for example, to adjust a phase relationship between two or more of the signals 265, 270 and 267 received by the input phase adjuster 235. For example, the input phase adjuster 235 may be used to adjust a phase relationship between the external clock signal 267 and one of the feedback clock signals 265 or 270, depending on which feedback clock signal is to be used as the feedback signal to the PLL 210. By adjusting the phase relationship between the external clock signal 267 and the desired PLL feedback clock signal 265 or 270, it may be possible for some embodiments to further optimize bus I/O timings or other timings for example.

Control inputs (not shown) coupled to the input phase adjuster 235 may be accessible via the TAP 291 or a software visible register, for example, to adjust the phase relationship between the desired signals. This adjustment may also be made using a VLSI tester to perform characterization type tests to determine a desired phase relationship to achieve a target performance level, for example.

For the embodiment of FIG. 2, as mentioned above, the PLL 210 may receive either the delayed local PLL feedback clock signal 265 or the global feedback clock signal 270 as the PLL feedback signal. In this manner, the embodiment of FIG. 2 provides flexibility to choose the PLL feedback signal that best meets the needs of the processor 200 manufacturer.

Figure 4:
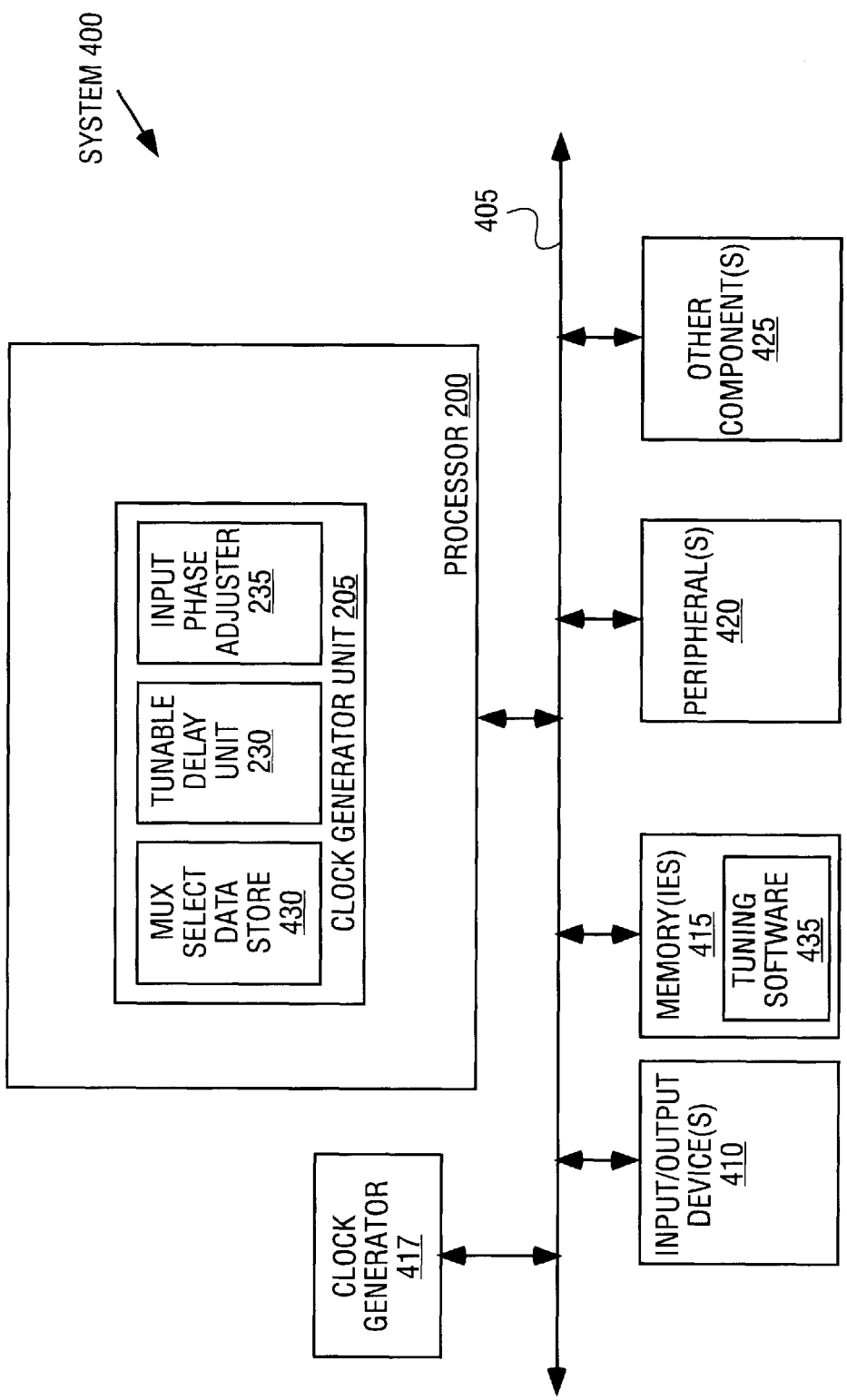
FIG. 4 is a block diagram of a system including the processor of FIG. 2.

For this embodiment, the mux 278 receives both the local and global PLL feedback clock signals 265 and 270 and is controlled by a select line 295 to select the signal to be received by the PLL 210. For one embodiment, the select line 295 is also controlled via the TAP 291. A register (not shown in FIG. 2) coupled to the select line 295, for example, may be programmed to store a bit that indicates whether to use the local or global PLL feedback clock signal 265 or 270. This programming may happen, for example, as the processor 200 is powered up. An example of such an embodiment is shown in FIG. 4 and described in more detail below.

The mux 275, which receives the external clock signal 267 at both its inputs, may also be included for some embodiments. The mux 275 may be matched in design to the mux 278 such that signal delays through the muxes 275 and 278 are similar. In this manner, a delay at the input of the PLL 210 that receives the external clock signal 267 may be matched to a delay at the input of the PLL 210 that receives one of the feedback clock signals 265 or 270.

The PLL 210, in response to receiving the external clock signal 267 and a selected one of the local or global PLL feedback clock signals 265 or 270, then produces the pre-core and core clock signals 252 and 253 as described above. It will be appreciated that the pre-core clock signal 252 may be the core clock signal if the divide-by-two unit 215 is not included, for example.

Figure 3:
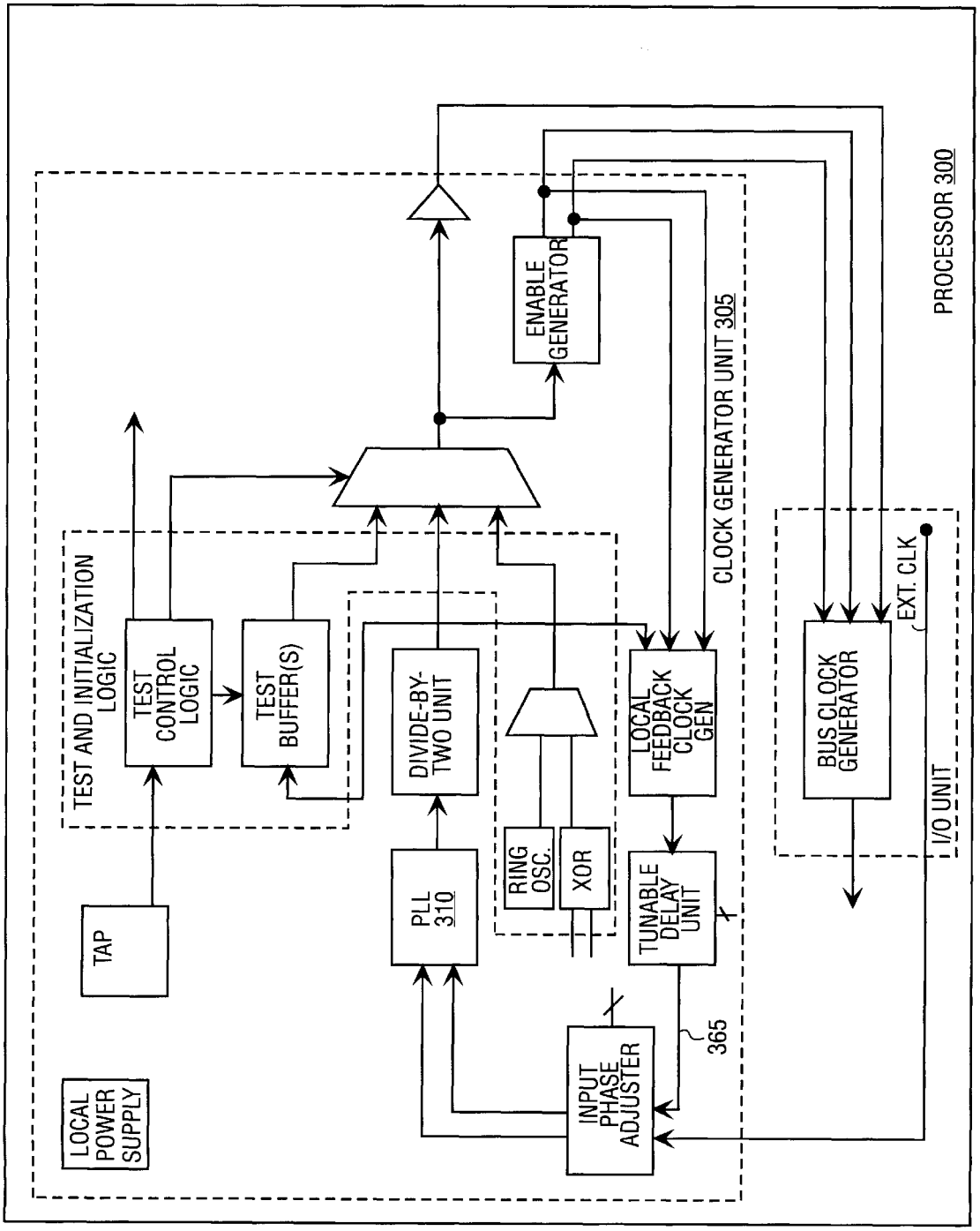
FIG. 3 is a block diagram showing a processor including a clock generator in accordance with an alternative embodiment.

For another embodiment, shown in FIG. 3, a processor 300 includes a clock generator unit 305 that does not include muxes at the inputs to a PLL 310. For the embodiment shown in FIG. 3, the PLL 310 only receives the delayed local PLL feedback clock signal 365 and not a global PLL feedback clock signal. The operation of the remaining elements of the clock generator unit 305 is similar to corresponding elements of the clock generator unit 205 of FIG. 2. By using only the local PLL feedback clock signal 365 as shown in FIG. 3, circuitry in the clock generator unit 305 may be reduced as compared to the clock generator unit 205 of FIG. 2. Further, it is not necessary to program a select mechanism to select one of the two PLL feedback signals as for the embodiment shown in FIG. 2.

For the above-described embodiments, (referring to FIG. 2, for exemplary purposes) using the (delayed) local PLL feedback clock signal 265 as the feedback signal to the PLL 210 can help to reduce clock jitter on PLL output clock signals such as the pre-core and core clock signals 252 and 253, for example. The local PLL feedback clock signal 260 (and 265) is derived from the core clock signal 253. For one embodiment, the core clock signal 253 is generated only a relatively short distance away from the local PLL feedback clock generator 225 as compared to a distance between the origination of the core clock signal 253 and the bus clock generator 250. In this manner, the core clock signal 253 may be affected to a lesser extent by noise from other circuitry in the processor 200 (or other host chip) when it reaches the local PLL feedback clock generator 225 such that delay variation in the signal is reduced.

Additionally, for some embodiments, a local power supply 289 for the clock generator unit 205 is an analog filtered power supply. For one embodiment, the analog power supply filter is implemented external to the processor 200 on a package containing the processor 200, for example. Because the clock generator unit 205 uses very little current as compared to other units on the processor 200, it is possible to filter the power supply 289. For units that use more current, such a filtered power supply may not be feasible. By filtering the power supply 289 for the clock generator unit 205, noise on a power supply signal provided to circuits in the clock generator unit 205 is reduced as compared to other units in the processor 200. This power supply noise can be a significant contributor to clock jitter. Thus, by generating the local PLL feedback clock signal 260 (and 265) within the clock generator unit 205, circuitry that may affect the quality of the core clock signal 253 as it is communicated to the local PLL feedback clock generator 225 uses the filtered power supply 289. In this manner, clock jitter on the output signal(s) provided by the PLL 210 may be further reduced. Thus, by using the local PLL feedback clock signal 260 instead of the global feedback clock signal 270 as the feedback signal to the PLL 210, clock jitter associated with the pre-core clock signal 252 and the core clock signal 253, for example, may be reduced.

FIG. 4 is a block diagram showing a system 400 in accordance with one embodiment, that may include, for example, the processor 200 of FIG. 2. The system 400 of FIG. 4 includes a bus 405 to communicate information and one or more input/output devices 410, one or more memories 415, a clock generator 417 and one or more peripheral devices 420 each coupled to the bus 405. The processor 400 is also coupled to the bus 405. The input and/or output devices 410 may include, for example, a keyboard, a cursor control device, a monitor and/or a printer. The one or more memories may include, for example, random access memory (RAM), read-only memory (ROM) and/or a mass storage device such as a hard disk drive and/or CD-ROM and a corresponding data storage medium. The clock generator 417 may be coupled to provide the external clock signal 267 (FIG. 2) (and possibly other system clock signals) which may also be generated by a PLL. The system 400 may also include other components 425 such as a network interface, a modem, etc.

For one embodiment, the system 400 may be a computer system. Other types of systems, however, are within the scope of various embodiments.

As described above in reference to FIG. 4, the tunable delay unit 230 and the input phase adjuster 235 are programmable to adjust the delay of the local PLL feedback clock signal 260 and the phase relationship between various signals, respectively. Also, as described above, the mux 278 is controllable to select either the local or global PLL feedback clock signal 265 or 270 to be provided to the PLL 210 (FIG. 2). The select line 295 of the mux 278 may, for example, be controlled by a value stored in a register or other type of mux select data store 430.

For one embodiment, as shown in FIG. 4, one or more of these controllable elements 230, 235 and/or 430 may be accessed and adjusted by tuning software 435 that is stored in one of the memories 415 of the system 400. This tuning software 430 may include individual components and/or instructions that tune different ones of the elements 230, 235 and 430. The tuning software may be included in a basic input/output system (BIOS) routine or in another type of system software or may be implemented as dedicated ROM code settings or other private instructions, for example. The software 430 may be accessible via a user interface (not shown) to the system 400, for example, to tune one or more of the controllable elements 230, 235 and/or 430 via the TAP (FIG. 2) or another externally accessible element in the processor 200. In this manner, the controllable elements 230, 235 and/or 330 may be adjusted at start-up of the system 300 or at another time. For other embodiments, the controllable elements 230, 235 and/or 330 are accessible in a different manner.

It will be appreciated that for other embodiments, the processor 300 of FIG. 3, or another integrated circuit device that includes a clock generator in accordance with aspects of the invention, may be included in a system similar to the system of FIG. 4.

Figure 5:
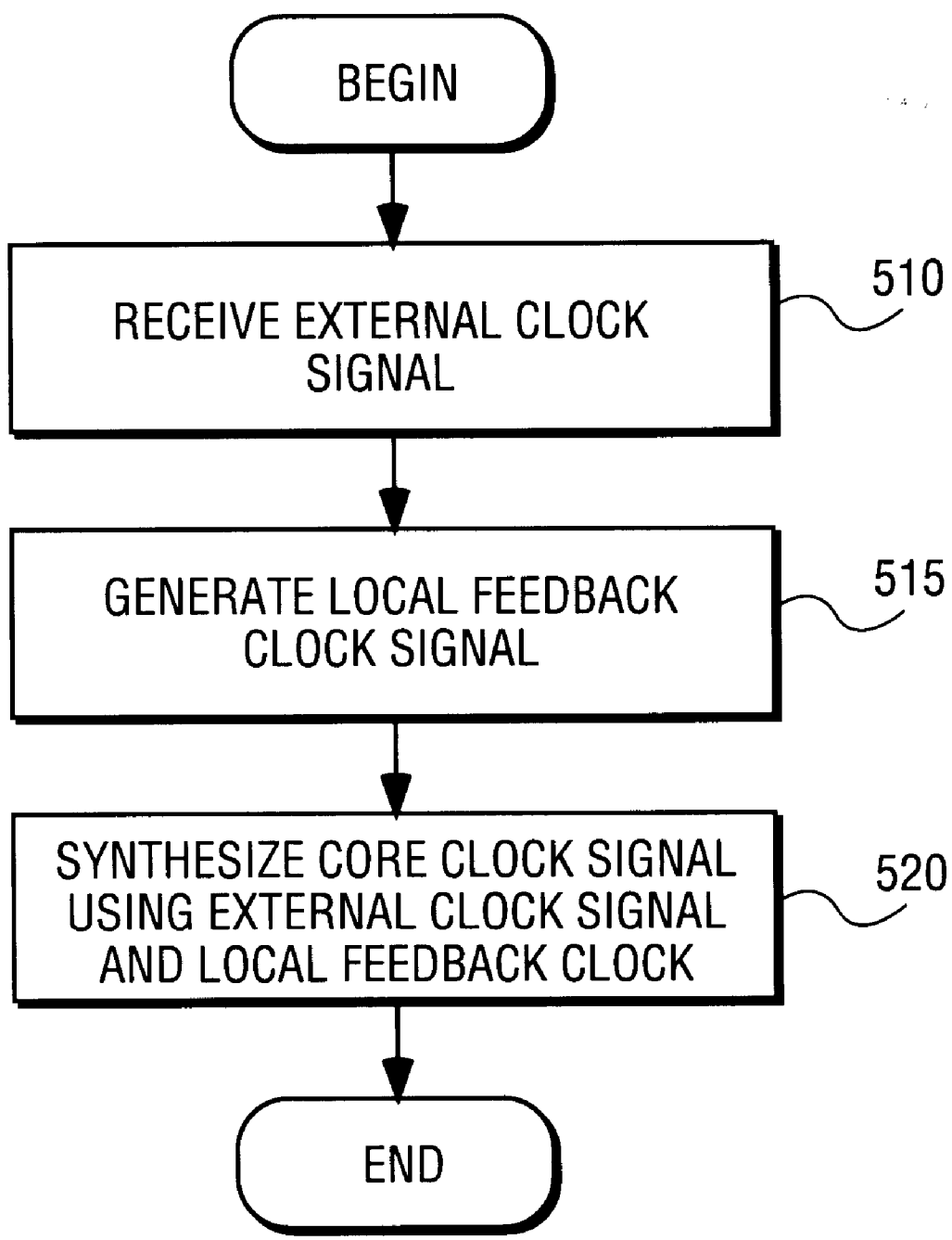
FIG. 5 is a flow diagram showing a method of one embodiment for reducing clock jitter.

FIG. 5 is a flow diagram showing a method of one embodiment for generating an on-die clock signal for use by an integrated circuit. At block 510 an external clock signal is received and at block 515, a local feedback clock signal is generated during a normal operating mode of the integrated circuit. At block 520, a core clock signal is synthesized for distribution across the integrated circuit using the external clock signal and the local feedback clock signal.

For other embodiments, the method may also include other actions such as, for example, generating the local feedback clock signal from the core clock signal, delaying the local feedback clock signal by a selected amount of time, selecting between a local and a global feedback signal and/or tuning a delay of the local feedback clock signal. Other actions are also within the scope of various embodiments.

In accordance with the above-described embodiments, a clock generator may provide an on-die clock signal with reduced clock jitter. The use of a local PLL feedback clock signal may contribute to this reduced jitter because it is derived from a core clock signal that originates relatively close to the feedback clock generator. This is in contrast to prior clock generators that use a global PLL feedback clock signal derived from a core clock signal that is distributed across the host chip. Further, the local PLL feedback clock signal may experience less noise because it is generated entirely within a clock generator unit. In this manner, the local PLL feedback clock signal may use a filtered power supply used by the clock generator unit and may not be affected by noisier power supplies in other areas of the host chip.

By reducing jitter of an on-die clock signal, it may be possible to improve overall performance of the host chip and/or system including the host chip. This is because external timings can be tightened with lower clock jitter.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An on-die clock generator comprising:
a phase-locked loop (PLL) circuit having a first input coupled to receive an external clock signal and an output coupled to provide an on-die clock signal, the on-die clock signal to be used during a normal operating mode of an integrated circuit; and
a local clock generator circuit having an input coupled to receive the on-die clock signal and an output coupled to provide a local PLL feedback clock signal to a second input of the PLL.

2. The on-die clock generator of claim 1 further comprising:
a delay unit having an input coupled to receive the local PLL feedback clock signal and an output coupled to the second input of the PLL, the delay unit being tunable to adjust a delay of the local PLL feedback clock signal.

3. The on-die clock generator of claim 2 wherein the tunable delay unit is tunable to match a delay of the local PLL feedback clock signal to a clock distribution delay of the on-die clock signal.

4. The on-die clock generator of claim 3 wherein the local clock generator circuit is matched in design to a bus clock generator circuit external to the on-die clock generator.

5. The on-die clock generator of claim 1 wherein the second PLL input is coupled to selectively receive one of the local PLL feedback clock signal or a global PLL feedback clock signal that is generated outside the clock generator.

6. The on-die clock generator of claim 1 further including
an input phase adjuster coupled to receive the local PLL feedback clock signal and the external clock signal, the input phase adjuster to adjust a phase relationship between the external clock signal and the local PLL feedback clock signal.

7. The on-die clock generator of claim 6 wherein outputs of the input phase adjuster are coupled to the first and second inputs of the PLL.

8. An on-die clock generator unit comprising:
a PLL circuit coupled to receive an external clock signal, the PLL to provide an on-die clock signal;
a local clock generation circuit coupled to receive the on-die clock signal, the local clock generation circuit to provide a local PLL feedback clock signal; and
a delay unit coupled to receive the local PLL feedback clock signal, the delay unit to delay the local PLL feedback clock signal to be provided to the PLL circuit by a selected amount.

9. The clock generator unit of claim 8 further including
a filtered power supply to supply power to circuits in the clock generator including the PLL circuit, the local clock generation circuit and the tunable delay unit, the filtered power supply being filtered to reduce noise on a power supply output signal.

10. The clock generator unit of claim 8 further including
an input phase adjuster coupled to adjust a phase relationship between the external clock signal and the local PLL feedback clock signal delayed by the tunable delay unit.

11. The clock generator unit of claim 8 wherein the delay unit is tunable to match a delay between the local PLL feedback clock signal and a clock distribution delay of the on-die clock signal.

12. The clock generator unit of claim 8 wherein the local clock generation unit is matched in design to a bus clock generation unit.

13. A method for generating an on-die clock signal for use during a normal operating mode of an integrated circuit, the method comprising:
receiving an external clock signal;
generating a local feedback clock signal during a normal mode of operation of the integrated circuit; and
synthesizing a core clock signal to be distributed across the integrated circuit using the external clock signal and the local feedback clock signal.

14. The method of claim 13 further including:
delaying the local feedback clock signal prior to synthesizing the core clock signal.

15. The method of claim 13 further including
adjusting a phase relationship between the external clock signal and the local PLL feedback clock signal prior to synthesizing the core clock signal.

16. The method of claim 13 further including
receiving a global PLL feedback clock signal; and
synthesizing the core clock signal using the external clock signal and one of the local or global PLL feedback clock signals.

17. An integrated circuit device comprising:
an input/output unit coupled to receive an external clock signal; and
a clock generator unit including
a local feedback clock generator to provide a local phase-locked loop (PLL) feedback clock signal, and
a phase-locked loop (PLL) circuit to synthesize an on-die clock signal in response to receiving the external clock signal from the input/output unit and the local PLL feedback clock signal, the on-die clock signal to be used during a normal operating mode of the integrated circuit device.

18. The integrated circuit device of claim 17 wherein the clock generator unit further includes
   a delay unit coupled between the local feedback clock generator and the PLL circuit to delay the local PLL feedback clock signal by a selected amount of time.

19. The integrated circuit device of claim 18 wherein the clock generator unit further includes
   a clock distribution network coupled to an output of the PLL circuit, the clock distribution network to distribute the on-die clock signal within the integrated circuit device; and
   wherein the delay unit is tunable to match the delay of the local PLL feedback clock signal to a delay of a signal in the clock distribution network.

20. The integrated circuit device of claim 17 wherein the clock generator unit further includes
   a filtered power supply, the power supply being filtered to reduce noise on a power supply signal provided to circuits within the clock generator unit.

21. The integrated circuit device of claim 18 further including
   a test access port wherein the tunable delay unit is tunable via the test access port.

22. The integrated circuit device of claim 18 wherein the clock generator unit further includes an input phase adjuster circuit coupled between the PLL circuit and the local feedback clock generator, the input phase adjuster circuit to adjust a phase relationship between the external clock signal and the local PLL feedback clock signal.

23. The integrated circuit device of claim 22 further including
   a test access port wherein the input phase adjuster circuit is controllable through the test access port.

24. The integrated circuit device of claim 17 wherein the input/output unit includes
   a bus clock generator unit, the bus clock generator unit to generate a bus clock signal to clock external transactions, and
   wherein the PLL circuit is coupled to selectively receive one of the local PLL feedback clock signal or a global PLL feedback clock signal provided by the bus clock signal.

25. The integrated circuit device of claim 23 wherein the local feedback clock generator is matched in design to the bus clock generator unit.

26. A system comprising:
   a bus to communicate information;
   a memory to store information;
   an external clock generator to provide an external clock signal; and
   a processor including
      an input/output unit coupled to receive the external clock signal, and
      a clock generator unit including
         a local clock generator to generate a local feedback clock signal, and
         a PLL circuit coupled provide an on-die clock signal in response to receiving the external clock signal from the input/output unit and the local feedback clock signal, the on-die clock signal to be used during a normal operating mode of the processor.

27. The system of claim 26 wherein the clock generator unit further includes
   a tunable delay unit coupled between the local clock generator and the PLL circuit to adjust a delay of the local feedback clock signal, and
   wherein the memory stores instructions that control tuning of the tunable delay unit.

28. The system of claim 26 wherein the input/output unit includes
   a bus generator unit to generate a bus clock signal in response to receiving the on-die clock signal,
   the PLL circuit being selectively coupled to receive one of the local feedback clock signal or a global feedback clock signal provided by the bus clock signal, and
   wherein the memory stores instructions that control the selection between the local and global feedback clock signals.

29. The system of claim 27 wherein the clock generator unit further includes
   an input phase adjuster circuit coupled between the PLL circuit and the local feedback clock generator, the input phase adjuster circuit to adjust a phase relationship between the local feedback clock signal and the external clock signal.

* * * * *